United States Patent [19]

Clapham et al.

[11] Patent Number: 5,199,999
[45] Date of Patent: Apr. 6, 1993

[54] ION IMPLANTATION IN METAL ALLOYS

[75] Inventors: Lynann Clapham; James L. Whitton, both of Stella, Canada

[73] Assignee: Queen's University, Kingston, Canada

[21] Appl. No.: 809,370

[22] Filed: Dec. 18, 1991

[51] Int. Cl.⁵ .............................................. C23C 8/36
[52] U.S. Cl. ..................... 148/239; 148/97; 148/900; 204/192.11; 204/192.12; 204/192.32; 428/610; 427/528; 427/531
[58] Field of Search ................. 148/97, 239, 900; 420/901; 428/610; 204/192.11, 192.12, 192.31, 192.32

[56] References Cited

U.S. PATENT DOCUMENTS 4,743,308  5/1988  Sioshansi et al. ............... 148/900
4,855,026  8/1989  Sioshansi ........................ 148/239

OTHER PUBLICATIONS

Z. L. Liau and J. W. Mayer, "Limits of Composition Achievable by Ion Implantation", *J. Vac. Sci. Technol.*, 15(5), Sep./Oct. 1978, pp. 1629–1635.

*Primary Examiner*—R. Dean
*Assistant Examiner*—Robert R. Koehler
*Attorney, Agent, or Firm*—Richard J. Hicks

[57] ABSTRACT

A method for ion implantation of relatively high concentrations of alloying elements into a metal target without sputtering the target, in which the target is precoated with a layer of preselected thickness of a light, low sputtering yield element such as carbon, which is ablated during the ion implantation process.

7 Claims, 5 Drawing Sheets

ION IMPLANTATION IN METAL ALLOYS

FIELD OF INVENTION

This invention relates to the implantation of relatively heavy ions in alloys, more particularly the invention relates to the production of high $T_c$ superconducting alloys.

BACKGROUND OF INVENTION

When producing alloys thermodynamic considerations generally restrict the amount of alloying component which can be added to the matrix. The process of energetic ion implantation can be used to increase the amount of alloying component, but again there is a limit in the amount of material which can be imposed because of process limitations, depending on the energy of the ion, its mass and the mass of the target material. The limit is reached when the rate of implantation is equalled by the rate of removal of the substrate or target due to sputtering. When attempting to produce high $T_c$ superconducting materials or the like by ion implantation, the limits of implantation are reached before the required concentrations of the different alloying elements can be reached. Thus there is a need to improve ion implantation techniques so that high $T_c$ superconducting alloys, among other products, can be produced.

Ion implantation to produce alloys can be divided into two classes, those with a low concentration of the implanted species (less than 1 at %) and those with a high concentration of the implanted species (greater than 10 at %). Low concentration, or 'dilute' alloys are relatively easy to achieve with low doses of implanted ions (around $10^{16}$ ions/cm$^2$), and a number of studies have reported dilute alloys formed in the Be, Al, Ni, Cu, and Fe systems. High dose implantation itself can be further subdivided into two—light ion implantation and heavy ion implantation. Of these, light ion implantation has been studied extensively with high dose implantation (from $1-10\times10^{17}$ ions/cm$^2$) of N, C, and Ti found to markedly enhance wear resistance in many applications. In particular, the success of N implantation treatments on dies, punches, cutting tools, wear pads, etc. has been well documented, with increases in component lifetimes from 2 to 20 times. High dose, heavy ion implantation is more problematical and heretofore has not been entirely successful.

OBJECT OF INVENTION

Thus, it is one object of the present invention to provide an improved process of ion implantation of heavy ions.

Another object is to provide alloy composites comprising a metal substrate containing greater than about 5 at % of at least one element having an atomic number greater than 24.

STATEMENT OF INVENTION

By one aspect of this invention there is provided a method for implanting into a target having an atomic number greater than 24, ions of at least one alloying element selected from elements having an atomic number greater than 24, comprising pre-coating said target with a solid element having an atomic number up to 14 so as to provide a sacrificial layer on said target which is ablated during said implantation.

By another aspect of this invention there is provide an alloy composite comprising a substrate of a metal having an atomic number of at least 24 having implanted therein greater than 5 at % of at least one alloying element having an atomic number of at least 24.

BRIEF DESCRIPTION OF PREFERRED EMBODIMENTS

Figure 1:
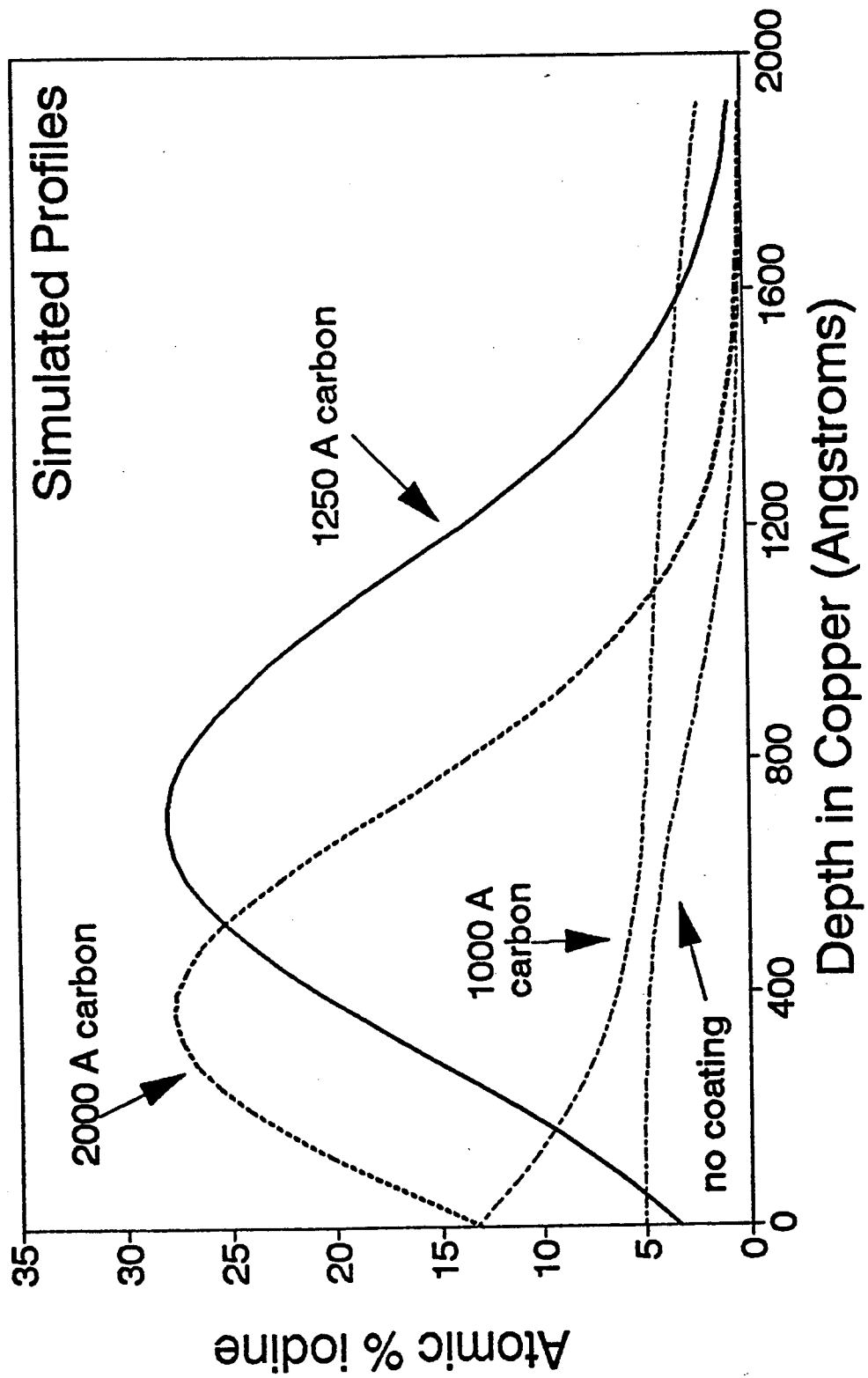
FIG. 1 is a graph illustrating a simulated profile using the PROFILECODE software for iodine in copper.

High dose, heavy ion implantation, while of considerable interest for the production of metastable alloys is a highly problematic process. In addition to the long implantation time required for a high dose, the process is limited by sputtering effects which establish a maximum achievable concentration. With lighter ionic species such as N, minimal sputtering occurs since $S_y$, the sputtering yield (i.e. the number of target atoms lost for each incoming ion) is around 0.1–2. Heavier ions, however, may have sputtering yields in excess of 30, with high dose implantations resulting in removal of considerable amounts of the target surface by sputtering. The saturation level, or maximum attainable concentration, is much lower (for example, of the order of 5 at %) than that which would occur with no sputtering (for example, of the order of 35 at %), and occurs when the flux of implanted species leaving the surface through sputtering equals the flux of implanted ions into the target through implantation.

While the sputtering yield $S_y$ of heavy ions into heavy targets is very high, the sputtering yields of those same heavy species into light target materials, such as carbon, are often quite low. This is due to both the reduced nuclear stopping cross section and also the lower atomic density associated with the lighter materials. Thus, a thin layer of a lighter low $S_y$ material deposited on the surface of a high $S_y$ target surface can be used as a slowly sputtering sacrificial layer during a heavy ion implant. While carbon (at no.6) is the preferred low $S_y$ material because of the ease of producing and maintaining a thin carbon film, it will be appreciated that any solid element up to atomic number 14, such as lithium (at no.3) beryllium (at no.4), sodium (at no.11), magnesium (at no.12) aluminum (at no.13) or silicon (at no.14) could also be employed in certain circumstances. Depending upon the desired product the high $S_y$ target may be any solid material between chromium (atomic number 24) and uranium (atomic number 92). The implanted ionic species may be selected from any element between atomic number 24 (chromium) and 92 (uranium).

For the purposes of illustration of this invention reference will be made hereinafter to copper targets (uncoated and carbon-coated) with iodine as the implant species. It will however, be appreciated that many other targets and implantable ions fall within the scope of this invention.

Experimental Procedure

Single crystal target discs of 1 cm diameter and about 1 mm thickness were spark machined from copper rods of 99.999% purity. All targets were of the <110> orientation. These targets were then ground on successively finer grit SiC paper, followed by polishing using 6 μm, and 0.25 μm diamond paste. The final preparation stage involved a vibratory polish for 24 hours using a Buehler Vibromet I and 0.05 μm aqueous alumina slurry. Half of the samples prepared in this way were then coated with a carbon layer of either 1000 Å or 1200 Å using a carbon evaporator equipped with a thickness monitor.

Ion implantation, using iodine as the implant species, was carried out using an NEC 1.7 MV accelerator. Three separate implants were carried out at energies of 600, 800 and 1000 keV. For each implant, two copper sample discs, one carbon coated and the other uncoated, were mounted side-by-side on a copper block target holder which was tilted at 7° to normal beam incidence (to avoid channeling). A 2 cm×1 cm aperture was placed in front of the samples, and the beam electrostatically scanned over an area slightly larger than this. This resulted in the entire surface area of each sample receiving an identical and uniform dose of iodine. Beam currents on target ranged from 0.5–2.0 μA and the total dose for each sample was:

| | |
|---|---|
| 600 keV | $2.28 \times 10^{17}$ ions/cm² |
| 800 keV | $2.21 \times 10^{17}$ ions/cm² |
| 1000 keV | $1.67 \times 10^{17}$ ions/cm² |

(the samples at 1000 keV received a lower dose as a result of technical problems). The sample temperature was monitored by means of a thermocouple contained in the target holder, and a steady flow of $N_2$ gas through holes drilled in the copper block was able to maintain this temperature at 38° for the entire course of the implant.

Rutherford Backscattering Spectrometry (RBS) was carried out on all samples, using a 4 MV Van de Graaff accelerator. A 2 mm diameter helium beam was used for analysis, at energies of either 2.0 or 3.5 MeV. The backscattered spectrum was measured by a surface barrier detector at a scattering angle of 165°.

Simulated Profiles

It will be appreciated that the thickness of the carbon coating is very important. If too thin it will not protect the sample throughout the implant procedure, if too thick the incoming ions may stop in the coating rather than in the underlying metal surface. Optimum coating thickness may be calculated empirically or by use of a simulation software program such as PROFILECODE, which is available from Implant Sciences, Mass. The PROFILECODE program employs 4-moment Pearson distribution functions to describe the instantaneous depth profile of an ion species in the target. To account for surface sputtering, the surface is incrementally removed as the implant calculation proceeds. The dose is divided into many intervals and the final profile is the sum of each depth-shifted intermediate profile.

Typical examples of the results from a PROFILECODE simulation run are shown in FIG. 1, for an iodine dose of $3 \times 10^{17}$ ions/cm² at an energy of 600 keV. The theoretical range of iodine in copper at this energy (assuming no sputtering) is 900 Å. The sputter yield with iodine ions incident at 600 keV is 18.7 for a copper surface and 3.6 for a carbon surface (PROFILECODE values). FIG. 1 shows the predicted depth profiles of iodine in the copper resulting from implants through different thicknesses of carbon layer (note that the carbon layer profile is not included).

In FIG. 1, the profile labelled "no coating" is the simulated result of iodine implanted into an uncoated copper surface. This very clearly illustrates the sputtering problem; the sample suffers a sputter loss of 6600 Å of surface for this dose, with a saturation concentration achieved of only 5 at % iodine. The total retention (i.e. the % of dose that is not lost through sputtering) is only 13.6% in this case.

The remainder of the profiles in FIG. 1 are simulations of the implantation of copper samples having carbon coatings of varying thicknesses. A carbon coating of 1000 Å improves retention somewhat, bringing it to 34%, but the situation is far from ideal since in addition to the complete loss of the carbon layer, 1200 Å of the copper surface is also removed by sputtering. 1250 Å of carbon, however, results in nearly full retention (97%) of the implanted iodine, and a peak iodine concentration of nearly 28% as shown in FIG. 1. In this case the $3 \times 10^{17}$ ions/cm² dose of iodine is predicted to have sputtered away only 1215 Å of carbon, leaving a residual carbon layer 35 Å thick.

Finally, with carbon layer thicknesses greater than 1250 Å not only is there a considerable residual carbon layer left on the copper surface, but some of the iodine stops within this layer. For the case of a 2000 Å carbon layer (FIG. 1), 800 Å of carbon has been left on the surface; contained within this layer is 15% of the total iodine dose. It is concluded, therefore, that for this energy and dose of iodine ions, the optimum carbon layer thickness should be between 1200 and 1250 Å.

EXAMPLE 1

Copper samples having no carbon coating

Figure 2:
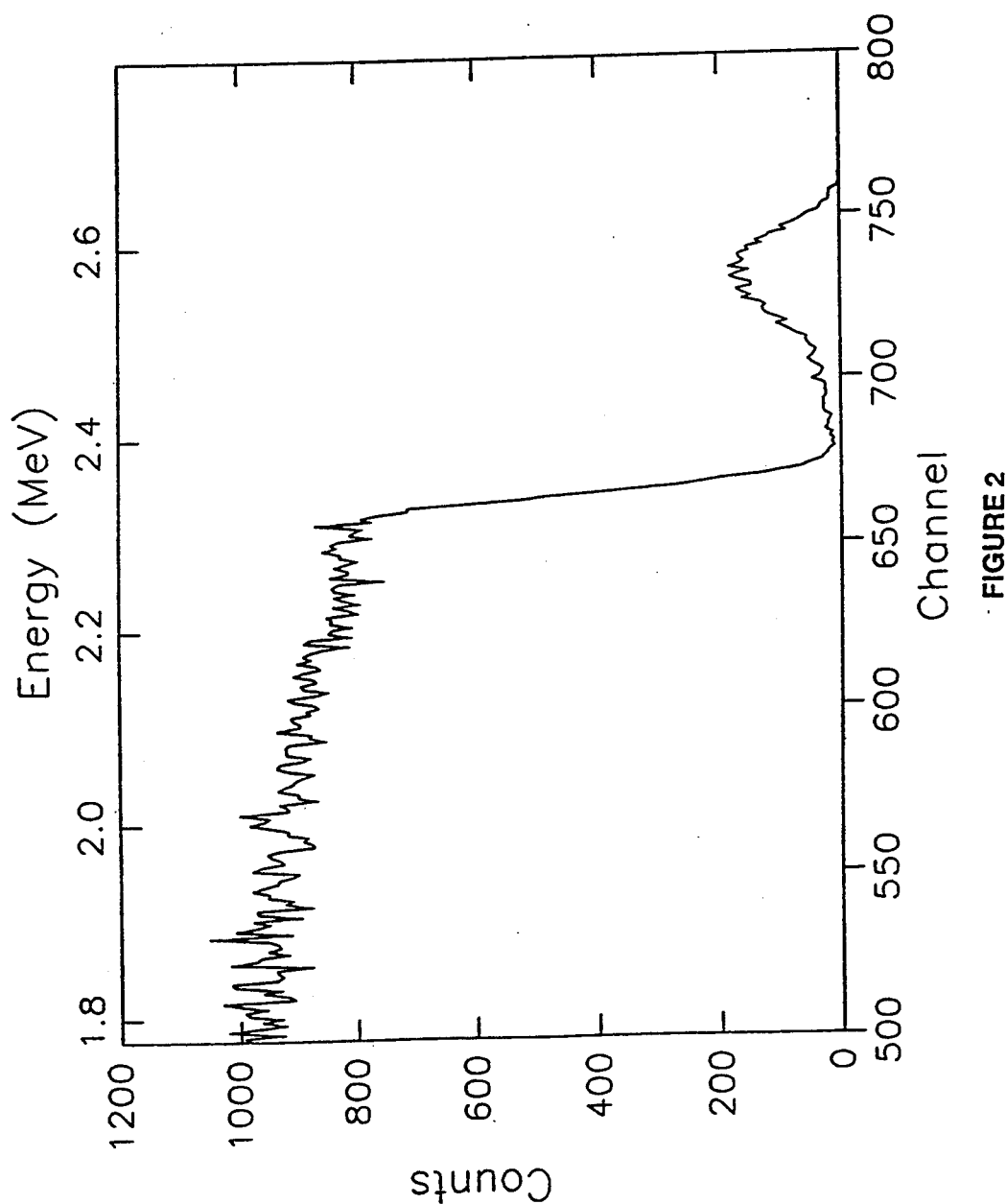
FIG. 2 is a graph showing an RBS result for iodine implanted in copper at 1000 keV, no coating.
Figure 3:
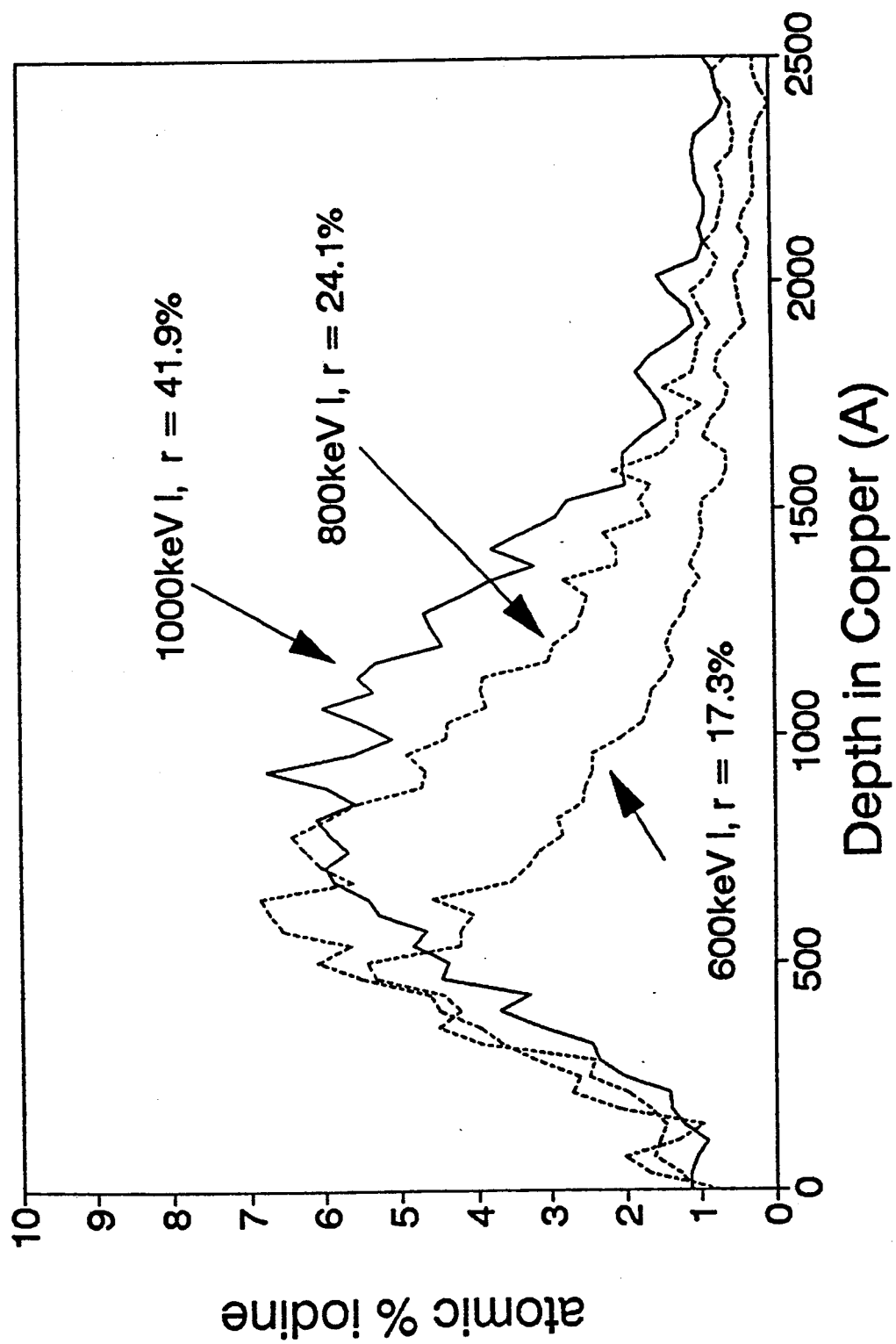
FIG. 3 is a profile concentration of iodine in uncoated copper at three implantation energy levels.

Copper samples implanted according to the procedure described previously were examined by RBS. FIG. 2 is a typical RBS result taken from the copper target (no carbon layer) implanted with 1000 keV iodine to a dose of $1.67 \times 10^{17}$ ions/cm² (for the sake of clarity, raw RBS data is shown for one energy only). The resulting concentration profiles for all three implantation energies are shown in FIG. 3. The retention 'r' is also included in this FIG., where r is the percentage of implanted species retained in the sample. FIG. 3 shows that as the iodine ion energy is increased two major differences can be observed - 1) the peak concentration moves deeper within the copper, and 2) the retention rises progressively. These results reflect the greater penetration depth of the more highly energetic ions, and likely also result from a decrease in sputtering yield with increasing energy (12) (i.e. $S_y = 18.7$ at 600 keV compared with 17.1 at 800 and 15.8 at 1000 keV). Overall, however, retention in the uncoated samples is low with the peak concentration of iodine between 5–7 at % (similar to that predicted by PROFILE-CODE for uncoated samples—FIG. 1).

EXAMPLE 2

Copper samples with carbon coating

Figure 4:
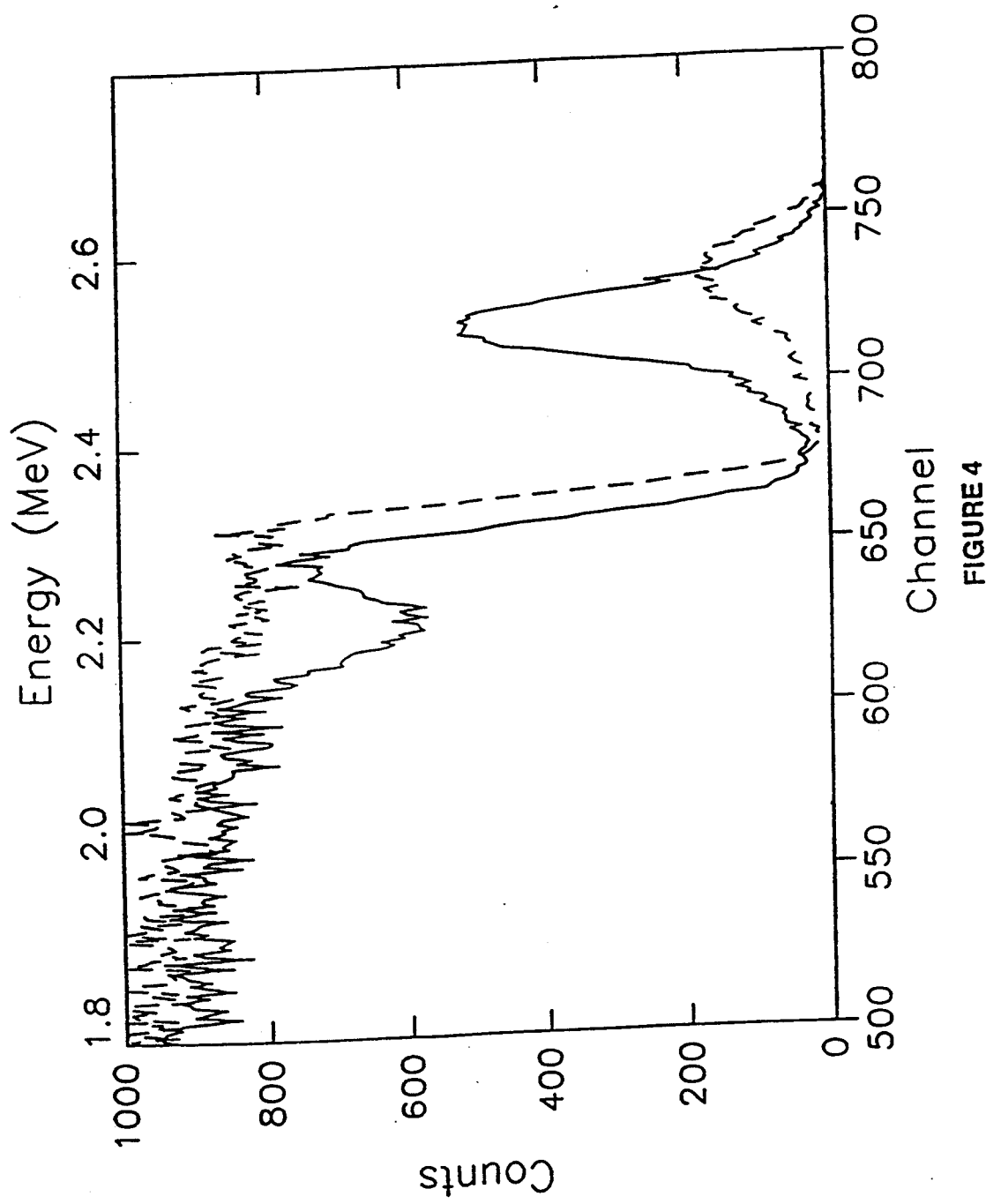
FIG. 4 is an RBS result, similar to FIG. 2, but with a carbon coated sample compared to an uncoated sample.

Copper samples were coated with a protective carbon coating and implanted as described in the Experimental Procedure. The samples were analyzed by RBS. FIG. 4 shows the RBS result for the carbon-coated, 1000 keV iodine-implanted samples (solid line). It can be seen that the iodine concentration in this case is sufficient to cause a significant dip in the copper signal. Also included for comparison is the RBS result of the sample implanted without a protective layer of carbon (dashed line). In the carbon-coated RBS result there is a noticable shift to lower energies in both the copper and iodine edges, compared to the uncoated result. This is consistent with the presence of a residual carbon layer (about 500 Å thick) on the sample surface. A residual carbon layer was present on all of the carbon coated samples, since at the time that the carbon deposition was performed it was estimated that the iodine dose would be $3 \times 10^{17}$ ions/cm$^2$, the actual dose being about one-third less. The residual carbon layers were approximately 350, 450 and 500 Å thick on the 600, 800, and 1000 keV implanted samples, respectively (as measured by RBS).

Figure 5:
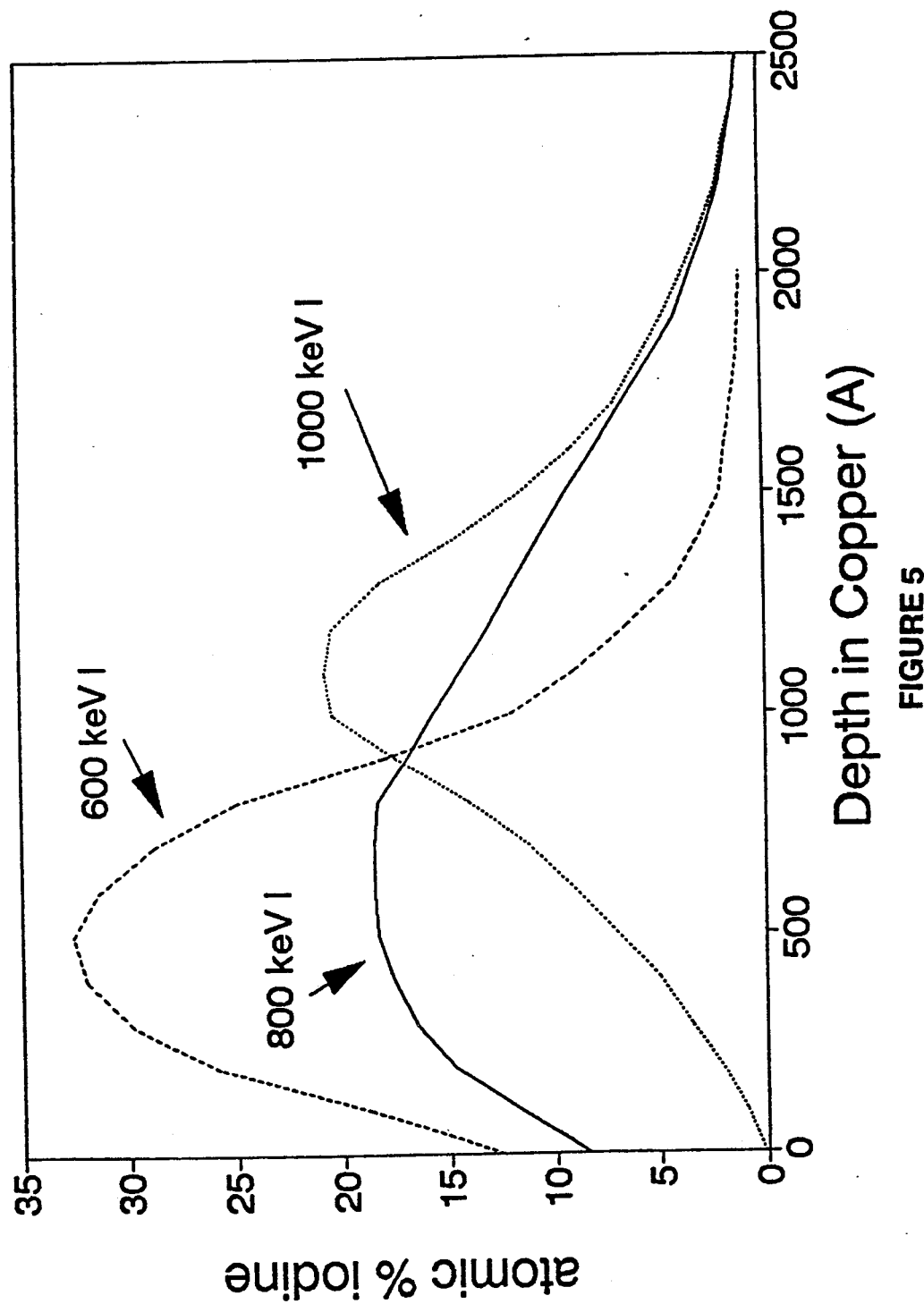
FIG. 5 is a profile concentration of iodine in carbon coated copper samples, for 3 implantation energies.

FIG. 5 shows the iodine depth profiles in the carbon coated samples for each implant energy (note that the carbon layer is omitted here). A comparison of FIGS. 3 and 5 (note difference in the Y-axis scale) shows clearly that much more iodine was retained when a carbon layer was utilized. The results are summarized in the Table below.

| energy | maximum concentration achieved (at %) | | % Retained Iodine | |
|---|---|---|---|---|
| | uncoated | c-coated | uncoated | coated |
| 600 kev | 6.5% | 33% | 17% | 88% |
| 800 kev | 5.8% | 18% | 24% | 95% |
| 1000 kev | 5.5% | 20% | 42% | 100% |

Carbon coating clearly results in a vast improvement in retention, and much higher iodine concentrations than in the uncoated case. The applicants believe that further improvements (with retentions always close to 100%) could be obtained if the technique were tailored to specific cases.

We claim:

1. A method for implanting into a target selected from at least one metal having an atomic number greater than 24, ions of at least one alloying element selected from elements having an atomic number greater than 24, comprising precoating said target with a solid element having an atomic number up to 14 so as to provide a sacrificial layer on said target which is ablated during said implantation.

2. A method as claimed in claim 2 wherein said solid element is carbon.

3. A method as claimed in claim 2 wherein said target is a metal having an atomic number between 24 and 30.

4. A method as claimed in claim 3 wherein said target is copper.

5. A method as claimed in claim 4 wherein said alloying element is selected from elements having an atomic number between 24 and 79.

6. A method as claimed in claim 5 wherein said alloying element is iodine.

7. A method as claimed in claim 5 wherein said alloying elements include barium and yttrium.

* * * * *